United States Patent [19]

Johnson

[11] 4,321,282
[45] Mar. 23, 1982

[54] SURFACE GRATINGS AND A METHOD OF INCREASING THEIR SPATIAL FREQUENCY

[75] Inventor: Leo F. Johnson, Bedminster, N.J.

[73] Assignee: Bell Telephone Laboratories, Incorporated, Murray Hill, N.J.

[21] Appl. No.: 232,154

[22] Filed: Feb. 6, 1981

[51] Int. Cl.³ .......................... G21K 3/00; B05D 3/06
[52] U.S. Cl. ...................................... 427/38; 427/10; 427/160; 427/162
[58] Field of Search ..................... 427/10, 38, 160, 162

[56] References Cited

U.S. PATENT DOCUMENTS 4,287,235 9/1981 Flanders .............................. 427/160

OTHER PUBLICATIONS

Shank et al., "Optical Technique for Producing 0.1μ Periodic Surface Structures", *Applied Physics Letters*, vol. 23, No. 3, pp. 154–155. Aug. 1973.

Johnson et al., "An Oblique Shadow Deposition Technique for Altering the Profile of Grating Relief Patterns on Surfaces", *Applied Physics Letters*, vol. 34, No. 9, pp. 578–580, May 1979.

Flanders et al., "Spatial Period Division-A New Technique for Exposing Submicrometer-Linewidth Periodic and Quasiperiodic Patterns", *J. Vac. Sci. Technol.*, vol. 16, No. 6, pp. 1949–1952, Nov./Dec. 1979.

Johnson et al., "Interference Gratings Blazed by Ion-Beam Erosion", *Applied Physics Letters*, vol. 35, No. 7, pp. 500–503, Oct. 1979.

*Primary Examiner*—James R. Hoffman
*Attorney, Agent, or Firm*—Richard D. Lauman

[57] ABSTRACT

A method is described for increasing the spatial frequency of surface relief structures. Periods as small as 750 Ångstroms have been made.

11 Claims, 14 Drawing Figures

SURFACE GRATINGS AND A METHOD OF INCREASING THEIR SPATIAL FREQUENCY

TECHNICAL FIELD

This invention is concerned with surface gratings and a method of increasing their spatial frequency.

BACKGROUND OF THE INVENTION

Surface relief structures, commonly referred to as surface gratings, are currently important and of interest in several technological areas. For example, such structures are important in integrated optics, ultraviolet spectroscopy, surface wave devices, negative resistance devices and distributed feedback lasers. The surface structure may have a constant or variable spatial period and while most contemplated structures have straight lines, curved line structures are useful for some purposes. The spatial period used in a device depends upon both the device type and desired characteristics. However, the spatial period in typical devices is generally less than several microns and, for many purposes, submicron periods are desirable.

Several methods have been used to fabricate surface relief structures and will be briefly described. The first method is described in *Applied Physics Letters*, 23, pp. 154–155, Aug. 1, 1973, and uses two interfering beams from a He-Cd laser emitting at 3250 Angstroms to create a periodic surface structure with a period limited to $\Delta/2n$ where $\Delta$ is the exposure wavelength and $n$ is the refractive index of the recording medium. Spatial periods smaller than $\Delta/2$ may be produced by using a prism and index matching fluid which reduces the wavelength in the exposure medium. A prism and an indexing matching fluid having a refractive index of approximately 1.5 produced periodic surface structures having a period of approximately 1100 Angstroms. However, smaller spatial periods using this method will most likely require coherent light sources having wavelengths shorter than that of the He-Cd laser used and such light sources are not readily available. This method produces a grating with the desired spatial period directly. Numerous profiles may be easily fabricated with this method and the ion beam erosion technique described in *Applied Physics Letters*, 35, pp. 500–503, Oct. 1, 1979. If smaller spatial periods are needed a first or parent structure having a first spatial period may be used to produce a second or child structure having a second and smaller spatial period. The second method, illustrating this approach and referred to by the authors as spatial period division, is described in *Journal of Vacuum Science Technology*, 16, pp. 1949–1952, (Nov./Dec., 1979). This method relies on the existence of intensity maxima in the near field diffraction pattern of a grating mask to produce periods smaller than that of the mask. X-ray radiation was used to produce a child grating having a period of 984 Angstroms from a parent grating having a period of 1968 Angstroms. The method, however, involves several processing steps and depends rather critically on the spacing between the parent and child gratings. Many of the contemplated devices using surface gratings will require spatial periods less than 1000 Angstroms and simpler methods of making such gratings are desirable.

SUMMARY OF THE INVENTION

It has been found that the spatial frequency of a surface structure may be increased by using the relief features of the structure to create a mask. After the mask has been produced, a portion of the exposed structure is removed to create a new structure. The method comprises depositing a mask material on at least a portion of the surface of the structure, exposing a section of the surface of the structure by removing part of the deposited mask material and removing material from the exposed section of the surface structure and thus increasing the spatial frequency of the parent structure. The mask material may be any material relatively impervious to the means, such as incident ion beam radiation, used to remove material from the exposed section of the surface. The mask material is conveniently removed by grazing ion beam etching. The method may be used to increase the spatial frequency of periodic surface structures, such as a rectangular grating in a photoresist on a surface and a triangular grating formed in a substrate, used in, e.g., distributed feedback lasers, negative resistance and surface wave devices. The method may also be used to increase the spatial frequency of nonperiodic, e.g., chirped, structures.

DETAILED DESCRIPTION

The invention will be described by reference to the spatial frequency doubling of two commonly used surface structures. These structures are a rectangular grating in a photoresist deposited on a substrate surface and a triangular grating in a substrate. After describing the invention with respect to these commonly encountered structures, those working in the art will understand and be able to use this invention with other structures.

Figure 1:
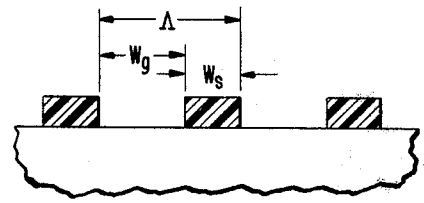
FIGS. 1–6 schematically represent the method of this invention as used for spatial frequency doubling of a rectangular grating.

FIG. 1 shows a surface structure comprised of a rectangular grating formed in a resist on a substrate surface. The grating has spatial period $\Delta$, a stripe width $w_s$ and a groove opening or spacing between the stripes of $w_g$. The grating may be fabricated by using a resist material, e.g., polymethyl methacrylate, and any of the presently conventional techniques for pattern delineation. For example, the substrate may be spin coated with the photoresist and then exposed to interfacing laser beams from a He-Cd laser. After exposure, the resist is developed and the grating is obtained.

Figure 2:
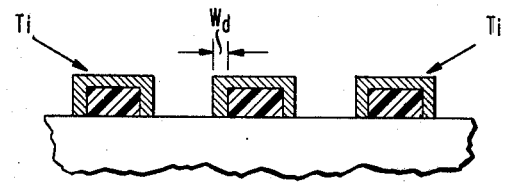

A suitable mask material, such as Ti, is deposited by oblique shadow deposition as shown in FIG. 2. This technique is described in *Applied Physics Letters*, 34, pp. 578–580, 1979. Other suitable materials include Ta, $SiO_2$, Al, Cr and $Si_3N_4$. Deposition is, as indicated, from both sides, and the precise deposition angle is a function of the aspect ratio of the surface structure. The desired deposition angle is easily ascertained. If it is desired that adjacent grooves in the spatial frequency doubled or child grating have equal width, the wall thickness, $w_d$, of the deposited mask material should be $w_d = \frac{1}{2}(w_g - w_s)$. If desired, adjacent grooves in the child grating may have different widths.

Figure 3:
Figure 4:
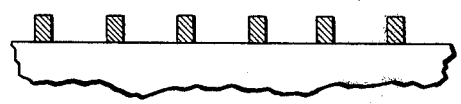

The cap of the mask material, that is, the material on top of the grating stripes is generally removed by a grazing ion beam etch as shown in FIG. 3. The ion beam will be incident from both sides as indicated. The energy of the ion beam is not critical but 2 keV has been found to yield good results. The amount of mask material removed is sufficient to expose a section of the surface of the structure. Material from the exposed section of the structure, e.g., resist material in the sequence depicted in FIGS. 1-6, is now removed and the spatial frequency of the structure is increased. The mask material should be relatively impervious to the ion beam, or other means used to remove material from the exposed section of the surface structure. The resist material is conveniently removed by a technique such as plasma or ion beam etching. The resulting structure is shown in FIG. 4. It is a rectangular child grating formed by mask material disposed on the substrate with a spatial frequency twice that of the parent grating, i.e., the spatial period is $\Delta/2$.

Figure 5:
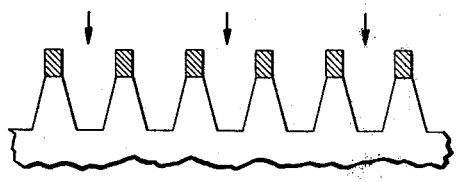
Figure 6:
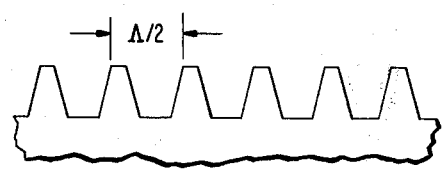

If desired, the grating structure formed by the mask material may be transferred to and formed in the substrate by ion beam etching as shown in FIG. 5. If the grating is to be transferred to the substrate, the substrate material and the mask material should have substantially different erosion rates when substrate material is removed. For example, the substrate may be etched by an ion beam and, after the desired depth has been reached, the mask material may be dissolved by a brief plasma etching in $CF_4$. The resulting structure is shown in FIG. 6. The spatial frequency of the grating is not changed by this step but the pattern has been transferred to and formed in the substrate.

The shape of the structure evolves with time and the initial erosion produces flat-bottomed grooves which result from the delay caused by a thin layer of Ti, or other mask material, deposited onto the substrate by reflection from the walls. Continued exposure of the structure to the ion beam results in deep triangular grooves.

Figure 7:
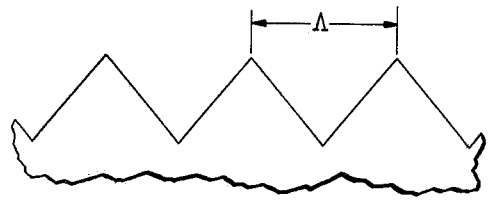
FIGS. 7–11 schematically represent the method of this invention as used for spatial frequency doubling of a triangular grating.

FIG. 7 shows a surface structure which is a triangular grating formed in a substrate, e.g., GaAs, having a spatial period $\Delta$. The triangular grating may be produced in the substrate from a rectangular grating in a resist having a period twice that of the substrate. Thus, the triangular grating may be obtained by continuing the process described with respect to FIGS. 1-6 until deep triangular grooves of approximately equal amplitude are obtained. Other methods of producing a triangular grating known to those working in the art, such as that described in *Applied Physics Letters*, 35, pp. 500-503, Oct. 1, 1979, may also be used.

Figure 8:
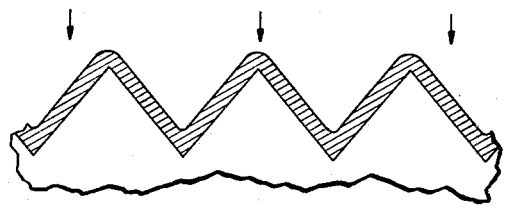
Figure 9:
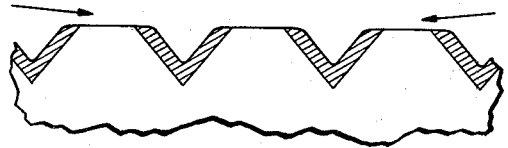
Figure 10:
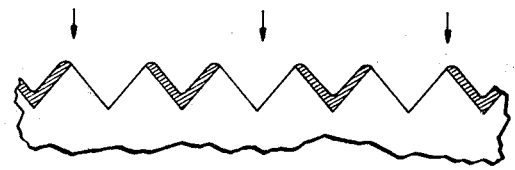
Figure 11:
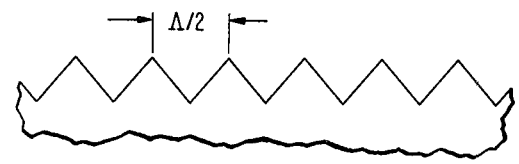

The mask material is deposited on the parent triangular grating at, for example, normal incidence as shown in FIG. 8 until the grating surface is completely covered by the mask material. The caps or peaks are then removed by grazing incidence ion beam etching as shown in FIG. 9 until at least a section of the surface of the substrate is exposed. In this step, as shown in FIG. 9, a portion of the surface of substrate material is also removed. Material is now removed from exposed section of the surface. Ion beam etching at normal incidence, as shown in FIG. 10, produces grooves in the substrate surface between the grooves of the parent grating. After ion beam etching has produced grooves of the desired depth, the remaining mask material is then dissolved, by well-known techniques, and the resulting structure or child grating has a spatial period of $\Delta/2$ as shown in FIG. 11. If desired, the process shown in FIGS. 7-11 may be repeated and a mask having a spatial period of $\Delta/4$ produced.

For many purposes, monitoring the depth of the etch into the substrate during the fabrication process is desirable because it facilitates production of the desired device characteristics. A real-time method of monitoring the etch depth is also desirable. A convenient method of monitoring the depth or amplitude of the evolving grating is by monitoring the intensity of a diffracted light beam. However, few suitable light sources are available for small period gratings. For example, diffraction from a 1500 Angstrom period grating requires a light source having a wavelength less than 3000 Angstroms.

Figure 12:
FIGS. 12–14 schematically represent the decomposition of an evolving grating into two gratings and the variation of diffraction intensity from the parent grating with erosion duration.
Figure 13:
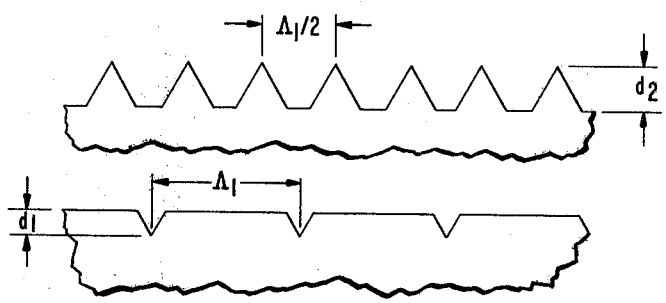
Figure 14:
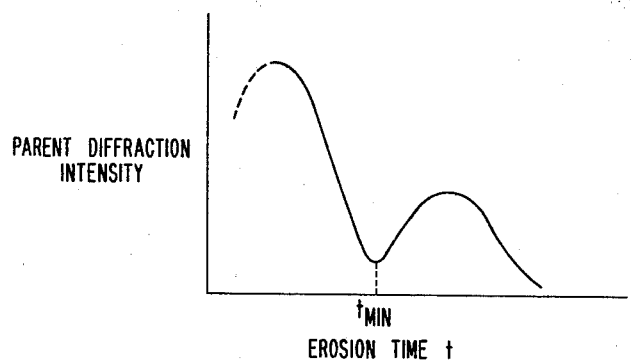

The evolution of a spatial frequency doubled grating may be monitored indirectly by measuring the diffraction intensity from the parent grating. This measurement will be described by reference to FIGS. 12-14. An evolving grating is shown in cross section in FIG. 12. The evolving grating of FIG. 12 may be decomposed into two gratings as shown in FIG. 13. In other words, the profile of FIG. 12 may be represented by two superimposed gratings of spatial periods $\Delta_1$ and $\Delta_2$ with the latter period equal to $\Delta_1/2$. The two gratings have amplitudes $d_1$ and $d_2$, respectively. Illumination of the surface by light having a wavelength greater than that of the spatial period of the parent grating results in diffraction only by the parent grating according to its amplitude $d_1$. Continued etching of the evolving grating produces adjacent grooves of nearly equal amplitudes in the spatial frequency doubled grating and the minimum residual parent amplitude $d_1$. This results in a corresponding minimum in the diffraction intensity from the parent grating as shown in FIG. 14 in which the parent diffraction intensity is plotted as a function of the etch time. Light sources and apparatus for measuring the light intensity are well known to those working in the art and need not be described in detail. The intensity at this minimum provides a rough measure of the purity of doubled grating. Typically, the minimum intensity was found to be approximately two percent of the diffraction intensity of the parent triangular grating.

Although the method has been described by reference to two specific embodiments, it is to be understood that the method can be used to increase the spatial frequency of other surface structures including chirped and curved gratings. Methods other than ion beam etching may be used when removal of material from the exposed section of the surface structure is desired. For example, plasma etching, reactive ion etching or chemical etching may be used. The mask material used should be relatively impervious to the removal means used. Gratings having spatial periods as small as 750 Angstroms have been made by the method described and smaller periods are possible. It should be recognized that the profile of the structure may be altered as the spatial frequency increases.

What is claimed is:

1. A method of increasing the spatial frequency of a surface structure comprising the steps of;
   depositing a mask material on at least a portion of the surface of said structure;
   exposing a section of the surface of said structure by removing part of the deposited mask material; and
   removing material from the exposed section of the surface structure whereby the spatial frequency of the structure is increased.

2. A method as recited in claim 1 in which said mask material is selected from the group consisting of Ti, Ta, $SiO_2$, Al, Cr, and $Si_3N_4$.

3. A method are recited in claim 2 in which said surface structure is a triangular grating in a substrate.

4. A method as recited in claim 2 in which said surface structure is a rectangular grating in a resist disposed on a substrate.

5. A method as recited in claim 4 in which said depositing is by oblique shadow deposition.

6. A method as recited in claim 2 in which said exposing of said section of said surface is by ion beam etching.

7. A method as recited in claim 6 in which said removing is by plasma etching.

8. A method as recited in claim 6 in which said removing is by ion beam etching.

9. A method as recited in claim 4 or 6 further comprising the step of removing substrate material.

10. A method as recited in claim 9 in which said removing of said substrate is by ion beam etching.

11. A method as recited in claim 9 further comprising the step of monitoring the etch depth of the evolving grating during said removing.

* * * * *